United States Patent
McAdoo, Jr. et al.

(10) Patent No.: US 7,676,725 B1
(45) Date of Patent: Mar. 9, 2010

(54) METHOD OF CODE GENERATION THAT MINIMIZES ERROR PROPAGATION

(75) Inventors: Leslie Newton McAdoo, Jr., Cheltenham (GB); Dean M. Evasius, Columbia, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 1047 days.

(21) Appl. No.: 11/365,953

(22) Filed: Feb. 27, 2006

(51) Int. Cl.
   *H03M 13/00* (2006.01)

(52) U.S. Cl. .............. 714/752; 714/723; 714/777; 714/760; 714/797; 341/59

(58) Field of Classification Search .......... 714/752, 714/723, 777, 760, 797; 341/59
   See application file for complete search history.

(56) References Cited

U.S. PATENT DOCUMENTS

| | | | |
|---|---|---|---|
| 4,463,344 A * | 7/1984 | Adler et al. ............. | 341/51 |
| 4,486,739 A | 12/1984 | Franaszek et al. | |
| 4,501,000 A | 2/1985 | Immink et al. | |
| 4,665,517 A | 5/1987 | Widmer | |
| 4,811,361 A | 3/1989 | Bacou et al. | |
| 4,818,995 A | 4/1989 | Takahashi et al. | |
| 4,882,583 A | 11/1989 | Dimitri et al. | |
| 4,924,463 A | 5/1990 | Thomas et al. | |
| 5,022,051 A | 6/1991 | Crandall et al. | |
| 5,200,979 A | 4/1993 | Harris | |
| 5,438,621 A | 8/1995 | Hornak et al. | |
| 5,491,479 A * | 2/1996 | Wilkinson ............. | 341/58 |
| 5,604,497 A * | 2/1997 | Sonntag ............. | 341/59 |
| 5,625,644 A | 4/1997 | Myers | |
| 6,333,704 B1 | 12/2001 | Jung et al. | |
| 6,362,757 B1 | 3/2002 | Lee et al. | |
| 6,456,208 B1 * | 9/2002 | Nazari et al. ............. | 341/59 |
| 6,587,977 B1 * | 7/2003 | Riggle et al. ............. | 714/701 |
| 6,604,222 B1 | 8/2003 | Jensen | |
| 6,877,131 B2 | 4/2005 | Kim et al. | |
| 7,124,349 B2 * | 10/2006 | Barrett et al. ............. | 714/776 |

* cited by examiner

*Primary Examiner*—M. Mujtaba K Chaudry
*Assistant Examiner*—Enam Ahmed
(74) *Attorney, Agent, or Firm*—Robert D. Morelli

(57) ABSTRACT

A method of generating a code that minimizes error propagation by selecting integers m, n, mrl, and a range of fractions od, where m represents the number of bits in an unencoded sequence, where n represents the number of bits in an encoded sequence, where mrl represents the maximum run length of an encoded sequence, and where od represents a range of ones densities of an encoded sequence. Next, generating an encoding map M that maps each unencoded sequence to an n-bit encoded sequence that satisfies od and mrl. Next, generating a decoding map N that maps each n-bit sequence to an m-bit sequence. Next, determining an error-propagation score for M and N. Then, returning to the step of generating M if a user requires a lower error-propagation score.

10 Claims, 1 Drawing Sheet

METHOD OF CODE GENERATION THAT MINIMIZES ERROR PROPAGATION

FIELD OF INVENTION

The present invention relates, in general, to coded data generation or conversion and, in particular, to "N" out of "M" codes.

BACKGROUND OF THE INVENTION

When transmitting binary data, it is common to employ an encoding that makes the resulting waveform more immune to noise, interference, and other channel degradations. There is a large class of transmission codes called block, or line codes, that are used to modulate binary symbols 0 and 1.

Line coding originated with the transmission of digital information across telephone lines, but the concept applies to any transmission line or channel. Different channel characteristics and performance requirements have led to the development of various types of line coding. Information rate, ones density, maximum run length, and error propagation are considerations that affect the choice of a line code.

To maximize information rate, or transmission efficiency, the transmitted signal should require as small a bandwidth as possible. For mBnB line codes, the information rate is expressed as m/n. The smaller the information rate of a line code, the greater the bandwidth requirement of the code.

It is desirable to have a code that contains little or no DC content. The DC content of a line code refers to the ratio of zeros and ones, or ones density, in the encoded bit stream. An equal number of zeroes and ones is described as having no DC content or having balanced DC content.

The waveform produced by a line code should contain sufficient timing information (i.e., sufficient transitions from logic level 0 to logic level 1) to enable the receiver to synchronize with the transmitter and to properly demodulate the transmitted signal. The amount of timing information in a line code is often measured by the maximum number of consecutive zeros or ones (i.e., maximum run length) that can occur in an encoded bit stream. This measure is useful because long runs of zeros or ones can cause the receiver to lose synchronization with the transmitter.

The error propagation of a line code should be as small as possible. Error propagation is the expected number of errors in an m-bit decoded word, assuming a single bit error in the transmitted n-bit word. Error propagation greater than m/n indicates that the line code increases the bit error rate for the decoded bit stream.

For example, a user may wish to transmit two binary bits (i.e., m=2). All possible combinations of two binary bits are 00, 01, 10, and 11. A 2B3B line code may be used to transmit the two binary bits. That is, each two binary bits to be transmitted will be encoded as three binary bits (i.e., n=3) and then transmitted. Such a line code has an information rate of m/n=2/3. One possible encoding map M for a 2B3B line code is 00→010, 01→100, 10→101, 11→011. The encoding map M has a ones density between 1/3 and 2/3. Each codeword includes either one bit that is a 1 or two bits that are a 1. So, an encoded bit stream will be between 1/3 and 2/3 ones. The maximum run length for the encoding map is three (i.e., sending 011 and then 100 results in three consecutive 1s being sent, sending 100 and then 011 results in three consecutive 0s being sent). One possible decoding map N that can be used to decode codewords encoded by the encoding map M described above is 000→00, 011→11, 010→00, 011→11, 100→01, 101→10, 110→01, 111→10. The error propagation of the M and N is calculated as follows. If a user wishes to transmit 00, it will be encoded as 010. A one-bit error during transmission (i.e., the number of errors expected in a transmission channel that has a Guassian distribution of errors) would result in 010 being received at the transmitter as either 110, 000, or 011. Decoding these three codewords results in 01, 00, and 11, respectively. These decoded words differ from the intended word (00) by one, zero, and two bits, respectively, for an error propagation of as much as two bits (11). Therefore, this 2B3B line code could turn a one-bit error caused by the transmission channel into a two-bit error in the decoded word.

U.S. Pat. No. 4,486,739, entitled "BYTE ORIENTED DC BALANCED (0,4) 8B/10B, PARTITIONED BLOCK TRANSMISSION CODE," discloses a 8B10B code that is partitioned into a 5B6B code and a 3B4B code. The present invention does not partition codes as does U.S. Pat. No. 4,486,739. U.S. Pat. No. 4,486,739 is hereby incorporated by reference into the specification of the present invention.

U.S. Pat. No. 4,501,000, entitled "METHOD OF CODING BINARY DATA," discloses a coding method that uses separation blocks of bits to concatenate information blocks of bits. The present invention does not use separation blocks of bits to concatenate information blocks of bits as does U.S. Pat. No. 4,501,000. U.S. Pat. No. 4,501,000 is hereby incorporated by reference into the specification of the present invention.

U.S. Pat. No. 4,665,517, entitled "METHOD OF CODING TO MINIMIZE DELAY AT A COMMUNICATION NODE," discloses a 8B10B code that is partitioned into a 5B6B code and a 3B4B code. The present invention does not partition codes as does U.S. Pat. No. 4,665,517. U.S. Pat. No. 4,665,517 is hereby incorporated by reference into the specification of the present invention.

U.S. Pat. No. 4,811,361, entitled "METHOD AND APPARATUS FOR TRANSMISSION OF DIGITAL DATA," discloses a method and device of encoding that uses flags such as start delimiter, and delimiter between encoded sequences. The present invention does not use such flags as does U.S. Pat. No. 4,811,361. U.S. Pat. No. 4,811,361 is hereby incorporated by reference into the specification of the present invention.

U.S. Pat. No. 4,818,995, entitled "PARALLEL TRANSMISSION SYSTEM," discloses an encoding method where timing alignment of encoded blocks is done prior to transmission. The present invention does not perform timing alignment of encoded blocks as does U.S. Pat. No. 4,818,995. U.S. Pat. No. 4,818,995 is hereby incorporated by reference into the specification of the present invention.

U.S. Pat. No. 4,882,583, entitled "MODIFIED SLIDING BLOCK CODE FOR LIMITING ERROR PROPAGATION," discloses a method of substituting a plurality of ones for each singleton one in an encoded sequence. The present invention does not substitute a plurality of ones for a singleton one in an encoded sequence as does U.S. Pat. No. 4,882,583. U.S. Pat. No. 4,882,583 is hereby incorporated by reference into the specification of the present invention.

U.S. Pat. No. 4,924,463, entitled "DATA CODING METHOD FOR USE IN DIGITAL COMMUNICATION SYSTEMS," discloses a method of interleaving encoded sequences. The present invention does not interleave encoded sequences as does U.S. Pat. No. 4,924,463. U.S. Pat. No. 4,924,463 is hereby incorporated by reference into the specification of the present invention.

U.S. Pat. No. 5,022,051, entitled "DC-FREE LINE CODE FOR ARBITRARY DATA TRANSMISSION," discloses a method of encoding that appends an indicator bit of known value to an encoded sequence, determining the polarity of the result, and transmitting the result inverted or not, depending on whether or not the polarity matches that of previous transmissions. The present invention does not append an indicator bit or invert a sequence based on the polarity of the sequence as does U.S. Pat. No. 5,022,051. U.S. Pat. No. 5,022,051 is hereby incorporated by reference into the specification of the present invention.

U.S. Pat. No. 5,200,979, entitled "HIGH SPEED TELECOMMUNICATION SYSTEM USING NOVEL LINE CODE," discloses a method of encoding that includes a transition bit and a DC-bias bit in each encoded sequence. The present invention does not include a transition bit or a DC-bias bit in each encoded sequence as does U.S. Pat. No. 5,200,979. U.S. Pat. No. 5,200,979 is hereby incorporated by reference into the specification of the present invention.

U.S. Pat. No. 5,438,621, entitled "DC-FREE LINE CODE AND BIT AND FRAME SYNCHRONIZATION FOR ARBITRARY DATA TRANSMISSION," discloses a method of encoding that adds bits to an encoded sequence and includes control and fill words. The present invention does not add bits to encoded sequences or includes control of fill words as does U.S. Pat. No. 5,438,621. U.S. Pat. No. 5,438,621 is hereby incorporated by reference into the specification of the present invention.

U.S. Pat. No. 5,625,644, entitled "DC BALANCED 4B/8B BINARY BLOCK CODE FOR DIGITAL DATA COMMUNICATIONS," discloses an encoding method that employs a start bit and an end bit with each encoded sequence. The present invention does not employ a start bit and an end bit as does U.S. Pat. No. 5,625,644. U.S. Pat. No. 5,625,644 is hereby incorporated by reference into the specification of the present invention.

U.S. Pat. No. 6,333,704, entitled "CODING/DECODING SYSTEM OF BIT INSERTION/MANIPULATION LINE CODE FOR HIGH-SPEED OPTICAL TRANSMISSION SYSTEM," discloses an encoding method where additional bits are inserted into encoded sequences. The present invention does not insert bits into encoded sequences as does U.S. Pat. No. 6,333,704. U.S. Pat. No. 6,333,704 is hereby incorporated by reference into the specification of the present invention.

U.S. Pat. No. 6,362,757, entitled "METHOD AND APPARATUS FOR ENCODING MB810 LINE CODE WITH THE CHARACTERISTICS OF MINIMUM BANDWIDTH AND DC-FREE," discloses an encoding method that employs a digital sum variation and an alternate sum variation. The present invention does not employ a digital sum variation or an alternate sum variation as does U.S. Pat. No. 6,362,757. U.S. Pat. No. 6,362,757 is hereby incorporated by reference into the specification of the present invention.

U.S. Pat. No. 6,604,222, entitled "BLOCK CODE TO EFFICIENTLY CORRECT ADJACENT DATA AND/OR CHECK BIT ERRORS," discloses a method of performing a logic operation on encoded bits to determine if an error is present. The present invention does not perform a logic function on encoded bits to determine if an error is present as does U.S. Pat. No. 6,604,222. U.S. Pat. No. 6,604,222 is hereby incorporated by reference into the specification of the present invention.

U.S. Pat. No. 6,877,131, entitled "APPARATUS AND METHOD FOR GENERATING BLOCK CODE IN A MOBILE COMMUNICATION SYSTEM," discloses an encoding method that uses a Reed-Muller code created using a Gold sequence. The present invention does not use a Reed-Muller code created from a Gold sequence as does U.S. Pat. No. 6,877,131. U.S. Pat. No. 6,877,131 is hereby incorporated by reference into the specification of the present invention.

There is a need for a method of minimizing error propagation in a line code, subject to information rate, ones density, and maximum run length. The present method is a method of generating a line code so that error propagation is minimized.

SUMMARY OF THE INVENTION

It is an object of the present invention to generate a code.

It is another object of the present invention to generate a code that minimizes error propagation.

It is another object of the present invention to generate a code that minimizes error propagation while setting information rate, ones density, and maximum run length.

The present method is a method of generating a code that minimizes error propagation.

The first step of the method is selecting an integer m, where m represents a length of unencoded bits.

The second step of the method is selecting an integer n, where n represents a length of encoded bits, and where n>m.

The third step of the method is selecting a range of fractions od, where od represents a range of density of bits with value one.

The fourth step of the method is selecting an integer mrl, where mrl represents a maximum run length of bits.

The fifth step of the method is generating an encoding map M, where each representation of $2^m$ bits is mapped to a unique representation in $2^n$, where the unique representations in $2^n$ to which the representations in $2^m$ are mapped satisfy od and mrl.

The sixth step of the method is generating a decoding map N, where each representation of $2^n$ bits is mapped to a representation in $2^m$.

The seventh step of the method is determining an error-propagation score for encoding map M and decoding map N.

The eighth step of the method is returning to the fifth step if a user requires an encoding map M and a decoding map N with a lower error-propagation score than the error-propagation score determined in the seventh step.

DETAILED DESCRIPTION

Figure 1:
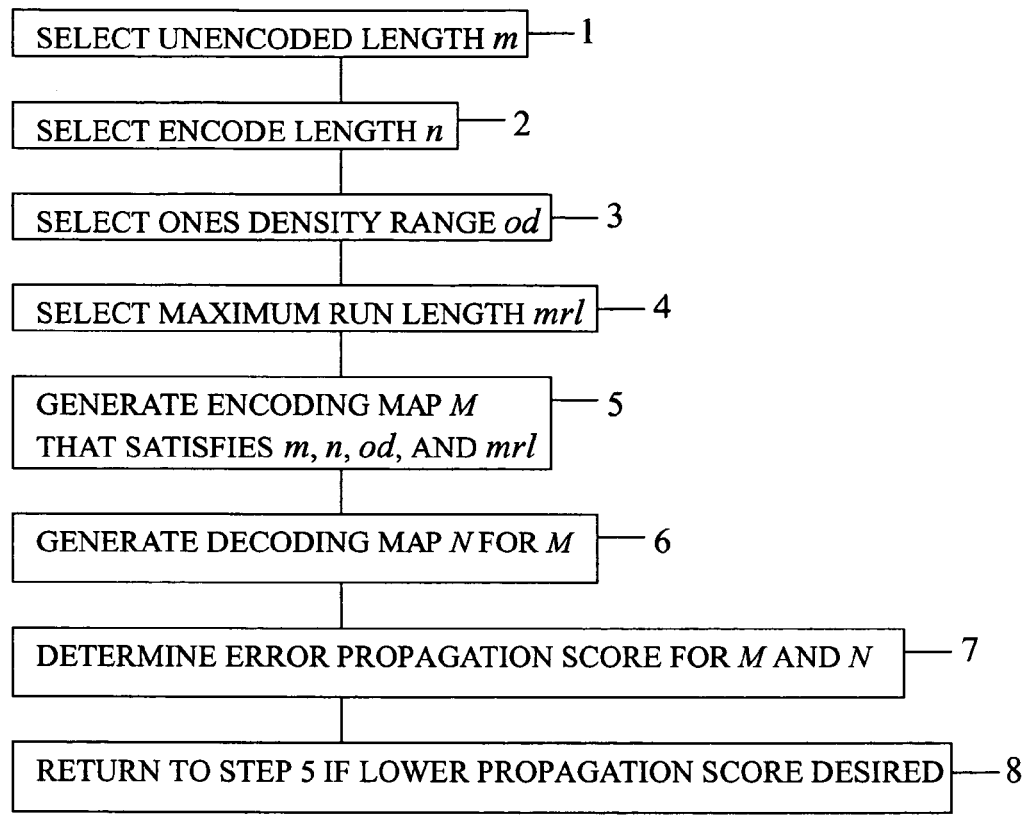
FIG. 1 is a flowchart of the steps of the present invention.

The present method is a method of generating a code that minimizes error propagation.

The first step 1 of the method is selecting an integer m, where m represents a length of unencoded bits. For example, a user may wish to transmit two binary bits. In this example, m=2. When m=2, all possible 2-bit unencoded sequences are 00, 01, 10, and 11.

The second step 2 of the method is selecting an integer n, where n represents a length of encoded bits, and where n>m. In the example above, a user may wish to encode each 2-bit unencoded sequence to 3 bits. In this example, n=3. An encoding scheme that encodes 2 bits into 3 bit is commonly referred to as a 2B3B line code. When n=3, all possible 3-bit encoded sequences are 000, 001, 010, 011, 100, 101, 110, and 111. Note that there are eight possible 3-bit sequences, but only four 2-bit sequences. Therefore, there are many different ways to map four things into eight things, and the number or ways increases dramatically when larger numbers for m and n are chosen. In an alternate embodiment, n can be selected to be an even integer greater than m, where $2^m$<combination (n, n/2)=n!/((n/2)!X((n/2)!)), where "X" represents multiplication, and "!" represents the factorial function. Doing so allows the user to set a ones density of exactly 50% (i.e., the same number or ones as there are zeros). There are some practical benefits for doing so. Setting m and n sets the information rate of the line code. The information rate of a line code is m/n. In the present example, the information rate is m/n=2/3.

The third step 3 of the method is selecting a range of fractions od, where od represents a density of bits with value one. Ones density is a design feature of an encoded sequence. It is desirable to have a ones density close to 50% (e.g., 40% to 60% or exactly 50%). The ones density of a line code is very much affected by od. In the present example, because n=3 there will be either one or two bits of the three encoded bits equal to 1. This is because 1 and 2 are the closest integers to n/2=3/2=1.5, and it is desirable to have the ones density close to 50%.

The fourth step 4 of the method is selecting an integer mrl, where mrl represents a maximum run length of bits. Maximum run length is another design feature of an encoded sequence. Maximum run length refers to both the maximum number of consecutive 1-bits or 0-bits that is possible using a particular mBnB line code. Encoded word boundaries are not observed when determining maximum run length. That is, if an encoded sequence ends with two consecutive 1-bits and the next encoded sequence starts with two consecutive 1-bits before a 0-bit occurs then these ones constitute a run length of 4. Since the maximum run length indicates the number of bits that occur before a bit transition occurs and transmission systems may derive a timing signal from the transmitted encoded sequences themselves then long run lengths may cause such systems to lose timing. Therefore, it is desired to keep the maximum run length to a small enough number to insure that timing will be maintained (e.g., mrl less than or equal to 4).

The fifth step 5 of the method is generating an encoding map M, where each representation of $2^m$ bits is mapped to a unique representation in $2^n$, where the unique representations in $2^n$ to which the representations in $2^m$ are mapped satisfy od and mrl. In the present example where m=2, n=3, and od is chosen to be the range from 1/3 to 2/3, and mrl may be chosen to be 3. In such an example, one possible encoding map M for this 2B3B line code is 00→010, 01→011, 10→100, 11→101. The encoding map M has a ones density of either 1/3 or 2/3 (i.e., each codeword includes either one bit that is a 1 or two bits that are a 1). The maximum run length for the encoding map M is three (i.e., sending 011 and then 100 results in three consecutive 1s being sent, sending 100 and then 011 results in three consecutive 0s being sent). In an alternate embodiment, the encoding map M is symmetric. If M is required to be symmetric then the number of possible encoding maps and, therefore, the time required to find encoding map M is reduced. M is said to be symmetrical if opposite bit sequences to be encoded (e.g., 00 and 11 are opposites) map to opposite encoded sequences (i.e., 00→010, 11→101, where 010 and 101 are opposites). Since M in the present example follows this pattern for each of its entries, it is symmetrical.

The sixth step 6 of the method is generating a decoding map N, where each representation of $2^n$ bits is mapped to a representation in $2^m$. Each representation of $2^n$ bits that appears in the encoding map M is mapped to the representation of $2^m$ bits to which it is mapped in the encoding map M. In the present example, 010, 011 100, and 101 appear in M. So, they appear in N with the same mapping, but reversed (i.e., 010→00, 011→01, 100→10, and 101→11). In an alternate embodiment, the decoding map N is symmetric. If N is symmetric, the number of possible decoding maps and, therefore, the time required to find a decoding map is reduced.

In the preferred embodiment, each representation of $2^n$ bits that does not appear in the encoding map M is mapped to a representation of $2^m$ bits in M by the following steps. The first substep 6(i) of the sixth step 6 is determining the minimum Hamming distance between each representation of $2^n$ bits that does not appear in M and the representations of $2^n$ bits that appear in M. Hamming distance is the number of bits positions that differ between two bit sequences (e.g, the Hamming distance between 001 and 100 is two). In the present example, 000, 001, 110, and 111 do not appear in M. After calculating the Hamming distances between 000 and each representation of $2^n$ bits that appear in M (e.g., 010, 011, 100, and 101), one finds that the minimum Hamming distance between these bit representation is one (e.g., 000 and 010).

The second substep 6(ii) of the sixth step 6 is determining all of the representations of $2^n$ bits that appear in the encoding map M that are within the Hamming distance determined in the first substep 6(i) to the representations of $2^n$ bits that do not appear in the encoding map M. In the present example, 000, 001, 110, and 111 do not appear in M. Bit representations 010 and 100 are the only bit representations within a Hamming distance of one of bit representation 000. Bit representations 011 and 101 are the only bit representations within a Hamming distance of one of bit representation 001. Bit representations 010 and 100 are within a Hamming distance of one of bit representation 110. Bit representations 011 and 101 are within a Hamming distance of one of bit representation 111.

The third substep 6(iii) of the sixth step 6 is determining the representations in $2^m$ bits that correspond to the representations in $2^n$ bits determined in the second substep 6(ii). In the present example, for 000, 010→00 and 100→10. For 001, 011→01 and 101→11. For 110, 010→00 and 100→10. For 111, 011→01 and 101→11.

The fourth substep 6(iv) is determining a bit-majority, if any, in each bit position of the representations of $2^m$ bits determined in the third substep 6(iii). In the present example, for 000, 00 and 10 have bit-majorities tie and 0. For 001, 01 and 11 have bit-majorities tie and 1. For 110, 00 and 10 have bit-majorities tie and 0. For 111, 01 and 11 have bit-majorities tie and 1.

If a bit-majority is not found for a bit position then the fifth substep 6(v) of the sixth step 6 is setting the bit position to the bit-majority, if any, of all of the bits in the representations of $2^m$ bits determined in the third substep 6(iii). In the present example, for 000, the bit majority for 00 and 10 is 0. For 001, the bit-majority for 01 and 11 is 1. For 110, the bit majority for 00 and 10 is 0. For 111, the bit-majority for 01 and 11 is 1.

If a bit-majority is not found then the sixth substep 6(vi) of the sixth step 6 is setting the bit position to 0. In the present example, this step need not be performed because all of the bit-majorities were resolved in the fifth substep 6(v). If symmetry is desired then the sixth substep 6(vi) of the sixth step 6 is setting the bit position to zero and setting the bit position of the corresponding opposite to a 1. For example, if the bit-majorities for both 001 and 110 are both tie then the bit-majority for 001 is 0 and the bit majority for 110 is 1.

The seventh substep 6(vii) of the sixth step 6 is mapping the representation of $2^n$ bits that does not appear in the encoding map M to the bit-majority bits determined in sixth substeps 6(iv), 6(v), and 6(vi). In the present example, 000→00, 001→11, 110→00, and 111→11. Note that the results are symmetric, which is consistent with the example where M and N are symmetrical.

The seventh step 7 of the method is determining an error-propagation score for encoding map M and decoding map N. In the preferred embodiment, the score is determined by setting SCORE=0, selecting a representation in $2^m$ bits, encoding the result of the selected representation in $2^n$ using encoding map M; selecting a bit position in the encoded representation in $2^n$, inverting the selected bit position, decoding the encoded representation with inverted bit position using decoding map N, determining the Hamming distance between the selected representation in $2^m$ and the result of decoding, adding the number to SCORE, selecting an unselected bit position in the encoded representation in $2^n$ if a bit position therein has not been selected and returning to the inverting substep, and selecting a representation in $2^m$ bits that has not been selected if every bit position in the encoded representation in $2^n$ has been selected and returning to the encoding substep.

In the present example, SCORE=0. Select 00. Encode 00 to 010. Select the leftmost bit in the encoded sequence (0). Invert it to a 1. Decode the selected representation with inverted bit 110 to 00. There are zero bit positions that are different from the result of decoding (00) and the selected representation (00). Therefore, increment SCORE by the number of bit positions found to be different (i.e., SCORE=0). Select the middle bit in the encoded sequence (1). Invert it to 0. Decode the selected representation with inverted bit 000 to 00. There are zero bit positions that are different from the result of decoding (00) and the selected representation (00). Therefore, increment SCORE by the number of bit positions found to be different (i.e., SCORE=0). Select the rightmost bit in the encoded sequence (0). Invert it to 1. Decode the selected representation with inverted bit 011 to 01. There is one bit position that is different from the result of decoding (00) and the selected representation (00). Therefore, increment SCORE by the number of bit positions found to be different (i.e., SCORE=1). Redo these steps for each of the other $2^m$ representations as follows.

Select 01. Encode 01 to 011. Select the leftmost bit in the encoded sequence (0). Invert it to a 1. Decode the selected representation with inverted bit 111 to 11. There is one bit position that is different from the result of decoding (11) and the selected representation (01). Therefore, increment SCORE by the number of bit positions found to be different (i.e., SCORE=2). Select the middle bit in the encoded sequence (1). Invert it to 0. Decode the selected representation with inverted bit 001 to 11. There is one bit position that is different from the result of decoding (11) and the selected representation (01). Therefore, increment SCORE by the number of bit positions found to be different (i.e., SCORE=3). Select the rightmost bit in the encoded sequence (1). Invert it to 0. Decode the selected representation with inverted bit 010 to 00. There is one bit position that is different from the result of decoding (00) and the selected representation (01). Therefore, increment SCORE by the number of bit positions found to be different (i.e., SCORE=4).

Select 10. Encode 10 to 100. Select the leftmost bit in the encoded sequence (1). Invert it to a 0. Decode the selected representation with inverted bit 000 to 00. There is one bit position that is different from the result of decoding (00) and the selected representation (10). Therefore, increment SCORE by the number of bit positions found to be different (i.e., SCORE=5). Select the middle bit in the encoded sequence (0). Invert it to 1. Decode the selected representation with inverted bit 110 to 00. There is one bit position that is different from the result of decoding (00) and the selected representation (10). Therefore, increment SCORE by the number of bit positions found to be different (i.e., SCORE=6). Select the rightmost bit in the encoded sequence (0). Invert it to 1. Decode the selected representation with inverted bit 101 to 11. There is one bit position that is different from the result of decoding (11) and the selected representation (10). Therefore, increment SCORE by the number of bit positions found to be different (i.e., SCORE=7).

Select 11. Encode 11 to 101. Select the leftmost bit in the encoded sequence (1). Invert it to a 0. Decode the selected representation with inverted bit 001 to 11. There is zero bit positions that are different from the result of decoding (11) and the selected representation (11). Therefore, increment SCORE by the number of bit positions found to be different (i.e., SCORE=7). Select the middle bit in the encoded sequence (0). Invert it to 1. Decode the selected representation with inverted bit 111 to 11. There is zero bit positions that are different from the result of decoding (11) and the selected representation (11). Therefore, increment SCORE by the number of bit positions found to be different (i.e., SCORE=7). Select the rightmost bit in the encoded sequence (1). Invert it to 0. Decode the selected representation with inverted bit 100 to 10. There is one bit position that is different from the result of decoding (10) and the selected representation (11). Therefore, increment SCORE by the number of bit positions found to be different (i.e., SCORE=8). Therefore the score for M and N of the example is 8.

In an alternate embodiment, more than one error may be introduced to an encoding. In this alternate embodiment, scoring is done as follows. Setting SCORE=0. Selecting a representation in $2^m$ bits. Encoding the selected representation using encoding map M. Selecting a user-definable number and position of bit positions in the encoding. Inverting the selected bit positions in the encoding. Decoding the encoding with inverted bits using decoding map N. Determining a number of bit positions that are different between the selected representation and the decoding. Adding the difference to SCORE. Selecting a user-definable error pattern for the encoded representation in $2^n$ that has previously not been selected and returning to the inverting substep. If no more error patterns are desired then selecting a representation in $2^m$ bits that has not previously been selected and returning to the encoding substep.

The eighth step 8 of the method is returning to the fifth step 5 if a user requires an encoding map M and a decoding map N with a lower error-propagation score than the error-propagation score determined in the seventh step 7.

In an alternate embodiment, bits are included in the code to indicate confidence in the determination of each bit in each representation of $2^n$ bits that does not appear in the encoding map M. For example, the following bits may be included in a decoding to indicate confidence: "00" for each majority resulting in a "0"; "11" for each majority resulting in a "1"; "01" for each tie resulting in a "0"; and "10" for each tie resulting in a "1."

What is claimed is:

1. A method of generating a code that minimizes error propagation, comprising the steps of:
   a) selecting an integer m, where m represents a length of unencoded bits;
   b) selecting an integer n, where n represents a length of encoded bits, and where n>m;
   c) selecting a range of fractions od, where od represents a range of density values of one bits;
   d) selecting in a transmission system an integer mrl, where mrl represents a maximum run length of bits;
   e) generating an encoding map M, where each representation of 2^m bits is mapped to a unique representation in 2^n, and wherein the unique representations in 2^n to which the representations in 2^m are mapped satisfy od and mrl;

f) generating a decoding map N, where each representation of 2^n bits is mapped to a representation in 2^m as follows:
   a. mapping each representation of 2^n bits that appears in the encoding map M to the representation of 2^m bits to which it is mapped in the encoding map M; and
   b. mapping each representation of 2^n bits that does not appear in the encoding map according to the following steps:
      i. determining the minimum hamming distance between the representation of 2^n bits and the representations of 2^n bits that appear in the encoding map M;
      ii. determining the representations of 2^n bits that appear in the encoding map M that are within the Hamming distance determined in step (i) to the representation of 2^n bits that does not appear in the encoding map M;
      iii. determining the representations in 2^m bits that correspond to the representation in 2^n bits determined in step (ii);
      iv. determining a bit-majority, if any, in each bit position of the representations of 2^m bits determined in step (iii);
      v. if a bit-majority is not found for a bit position then setting the bit position to the bit-majority, if any, of all of the bits in the representations on 2^m bits determined in step (iii);
      vi. if a bit-majority is not found then setting the bit position to zero; and
      vii. mapping the representation of 2^n bits that does not appear in the encoding map M to the bit-majority bits determined in steps (iv), (v), and (vi);
g) determining an error-propagation score for encoding map M and decoding map N; and
h) returning to step (e) if a user requires an encoding map M and a decoding map N with a lower error-propagation score than the error-propagation score determined in step (g).

2. The method of claim 1, wherein the step of selecting an integer n is comprised of the step of selecting an integer n, where n represents a length of encoded bits, where n>m, and where $2^m <$ combination $(n, n/2) = n!/((n/2)! X ((n/2)!))$.

3. The method of claim 1, wherein the step of selecting a range of fractions od, where od represents a range of density values of one bits is comprised of the step of selecting a range of fractions od, where od represents a range of density values of one bits, and where od is in the range of 40% to 60% of n.

4. The method of claim 1, wherein the step of selecting an integer mrl, where mrl represents a maximum run length of bits is comprised of the step of selecting an integer mrl, where mrl represents a maximum run length of bits, and where mrl is less than n.

5. The method of claim 1, wherein the step of generating an encoding map M, is comprised of the step of generating an encoding map M, where each representation of $2^m$ bits is mapped to a unique representation in $2^n$, and where the unique representations in $2^n$ to which the representations in $2^m$ are mapped satisfy od and mrl, and where encoding map M is symmetric.

6. The method of claim 1, wherein the step of generating a decoding map N, is comprised of the step of generating a decoding map N, where each representation of $2^n$ bits is mapped to a representation in $2^m$, and where decoding map N is symmetric.

7. The method of claim 1, wherein the step of determining an error-propagation score for encoding map M and decoding map N is comprised of the following steps:
   (a) setting SCORE=0;
   (b) selecting a representation in $2^m$ bits;
   (c) encoding the result of step (b) using encoding map M;
   (d) selecting a bit position in the result of step (c);
   (e) inverting the selected bit position in the result of step (c);
   (f) decoding the result of step (e) using decoding map N;
   (g) determining a number of bit positions that are different between the results of steps (b) and (f);
   (h) adding the result of step (g) to SCORE;
   (i) if a bit position in the result of step (c) has not been selected then selecting an unselected bit position in the result of step (c) and returning to step (e); and
   (j) if every bit position in the result of step (c) has been selected then selecting a representation in $2^m$ bits that has not been selected and returning to step (c).

8. The method of claim 1, wherein the step of determining an error-propagation score for encoding map M and decoding map N is comprised of the following steps:
   (a) setting SCORE=0;
   (b) selecting a representation in $2^m$ bits;
   (c) encoding the result of step (b) using encoding map M;
   (d) selecting a user-definable subset of bit positions in the result of step (c);
   (e) inverting the selected bit positions in the result of step (c);
   (f) decoding the result of step (e) using decoding map N;
   (g) determining a number of bit positions that are different between the results of steps (b) and (f);
   (h) adding the result of step (g) to SCORE;
   (i) if bit positions in the result of step (c) have not been selected and a user desires to select an unselected bit position then selecting an unselected user-definable number and position of bit positions in the result of step (c) and returning to step (e); and
   (j) selecting a representation in $2^m$ bits that has not been selected and returning to step (c).

9. The method of claim 1, further including the step of including bits in the code to indicate confidence in the determination of each bit in each representation of $2^n$ bits that does not appear in the encoding map M.

10. The method of claim 9, wherein the step of including bits in the code to indicate confidence in the determination of each bit in each representation of $2^n$ bits that does not appear in the encoding map M is comprised of the following steps:
   (a) including "00" for each majority resulting in a "0";
   (b) including "11" for each majority resulting in a "1";
   (c) including "01" for each tie resulting in a "0"; and
   (d) including "10" for each tie resulting in a "1."

* * * * *